United States Patent
Inaba

(10) Patent No.: US 10,658,535 B2
(45) Date of Patent: May 19, 2020

(54) SOLAR CELL MODULE AND METHOD OF MANUFACTURING THE SAME

(71) Applicants: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

(72) Inventor: Hirotaka Inaba, Kariya (JP)

(73) Assignees: KABUSHIKI KAISHA TOYOTA JIDOSHOKKI, Kariya-shi, Aichi-ken (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/868,471

(22) Filed: Jan. 11, 2018

(65) Prior Publication Data

US 2018/0204966 A1 Jul. 19, 2018

(30) Foreign Application Priority Data

Jan. 13, 2017 (JP) ................... 2017-004251

(51) Int. Cl.
*H01L 31/048* (2014.01)
*H01L 31/18* (2006.01)
(Continued)

(52) U.S. Cl.
CPC ............ *H01L 31/048* (2013.01); *H01L 31/05* (2013.01); *H01L 31/0504* (2013.01);
(Continued)

(58) Field of Classification Search
CPC ..... H02S 40/30–36; H01L 31/05–0516; H01L 31/054–056; H01L 31/02167; H01L 31/02168
See application file for complete search history.

(56) References Cited

U.S. PATENT DOCUMENTS 4,433,200 A * 2/1984 Jester ................... H01L 31/048 136/244
5,110,369 A * 5/1992 Tomstrom ............. H01L 31/048 136/244
(Continued)

FOREIGN PATENT DOCUMENTS

GB 2247564 A * 3/1992 ............. B64G 1/443
JP 09018044 A * 1/1997
(Continued)

OTHER PUBLICATIONS

Machine translation of JP10-051022A.*
(Continued)

*Primary Examiner* — Eric R Smith
(74) *Attorney, Agent, or Firm* — Sughrue Mion, PLLC

(57) ABSTRACT

A solar cell module includes: a first cover in the form of a plate having at least a portion transparently; a second cover disposed to face the first cover; at least one solar cell disposed between the first cover and the second cover; a sealing material which fills a space between the first cover and the second cover and joins them together to thus seal the solar cell; and terminals electrically connected to the solar cell, surrounded by the sealing material between the first cover and the second cover, and serving as a conductor. At least one of the first cover and the second cover has a boss as a positioning portion which positions the terminals. The terminal contacts the first cover having the boss.

6 Claims, 4 Drawing Sheets

(51) Int. Cl.
  *H01L 31/05* (2014.01)
  *H02S 40/20* (2014.01)
(52) U.S. Cl.
  CPC .............. *H01L 31/18* (2013.01); *H02S 40/20* (2014.12); *Y02E 10/50* (2013.01)

(56) References Cited

U.S. PATENT DOCUMENTS

| | | | | |
|---|---|---|---|---|
| 5,149,351 | A * | 9/1992 | Yaba | B60J 7/04 257/E27.125 |
| 6,166,321 | A * | 12/2000 | Sasaoka | H01L 31/02008 136/251 |
| 2003/0010377 | A1* | 1/2003 | Fukuda | H01L 31/048 136/251 |
| 2009/0114262 | A1* | 5/2009 | Adriani | B23K 1/0008 136/244 |
| 2010/0037945 | A1* | 2/2010 | Tsunoda | B32B 17/10036 136/256 |
| 2010/0147356 | A1* | 6/2010 | Britt | H01L 31/02008 136/244 |
| 2013/0056758 | A1* | 3/2013 | Ziltener | H01L 31/0296 257/88 |
| 2014/0130866 | A1* | 5/2014 | Yoshimine | H01L 31/02363 136/259 |
| 2015/0007876 | A1* | 1/2015 | Komai | H01L 31/0516 136/256 |
| 2016/0276509 | A1 | 9/2016 | Mitsuzawa et al. | |
| 2016/0356406 | A1* | 12/2016 | Burgess | B23P 19/00 |

FOREIGN PATENT DOCUMENTS

| | | | |
|---|---|---|---|
| JP | H09-55531 | A | 2/1997 |
| JP | 10051022 | A * | 2/1998 |
| JP | 2005-191479 | A | 7/2005 |
| JP | 2010267717 | A | 11/2010 |
| JP | 2016-171274 | A | 9/2016 |
| JP | 2017-188584 | A | 10/2017 |
| WO | 2013/018533 | A1 | 2/2013 |

OTHER PUBLICATIONS

Machine translation of JP09-018044A.*
Definition of diameter [retrieved from https://www.collinsdictionary.com/dictionary/english/diameter on Apr. 23, 2019].*

* cited by examiner

SOLAR CELL MODULE AND METHOD OF MANUFACTURING THE SAME

This nonprovisional application is based on Japanese Patent Application No. 2017-004251 filed on Jan. 13, 2017, with the Japan Patent Office, the entire contents of which are hereby incorporated by reference.

BACKGROUND OF THE INVENTION

Field of the Invention

The present invention relates to a solar cell module, and more particularly, to a solar cell module mounted on a vehicle.

Description of the Background Art

Japanese Patent Laid-Open No. 2005-191479 discloses a structure in which a plurality of solar cells are sealed in a sealing material and have opposite surfaces provided with a protective member. A solar cell is a single-crystal silicon solar cell having back side with a P-type electrode and an N-type electrode, and adjacent solar cells have a P-type electrode and an N-type electrode connected in series via an interconnector. A plurality of connection points for connecting the P-type electrode and the interconnector are provided along a side edge of one side of the solar cell, and a plurality of connection points for connecting the N-type electrode and the interconnector are provided along a side edge of a side facing to that side. A plurality of solar cells have the P type electrode connection points and the N type electrode connection points disposed adjacently and adjacent solar cells have the plurality of P type electrode connection points and the plurality of N type electrode connection points connected by the interconnector in the form of a single flat plate.

SUMMARY OF THE INVENTION

In general, a solar cell module is fabricated as follows: on a protective member, a sealing material, a solar cell, the sealing material, and a protective member are sequentially disposed in layers, and heated and pressurized by a laminating apparatus to cure the sealing material to thus bring each member into close contact with each other, i.e., perform a laminating process.

In the laminating process, front and back plates thermally expand and contract, and each member may positionally be displaced or the interconnector may be damaged. Such a damage remarkably appears when resin such as polycarbonate is used for the front plate especially for weight reduction.

The present invention has been made to solve the above problem, and contemplates a solar cell module capable of reliably positioning a conductor in the solar cell module.

According to the present invention, a solar cell module comprises: a first cover in a form of a plate having at least a portion transparently; a second cover disposed to face the first cover; at least one solar cell disposed between the first cover and the second cover; a seating material which fills a space between the first cover and the second cover and joins them together to thus seal the solar cell; and a conductor electrically connected to the solar cell and surrounded by the sealing material between the first cover and the second cover. At least one of the first cover and the second cover has a positioning portion to position the conductor. The conductor is in contact with at least one of the first and second covers having the positioning portion.

The solar cell module with at least one of the first and second covers having the positioning portion to position the conductor can reliably position the conductor. Furthermore, with the conductor in contact with the first and/or second covers having the positioning portion, no sealing material is interposed between the first and/or second covers having the positioning portion and the conductor. This can positionally stabilize and thus reliably position the conductor.

Preferably, a plurality of solar cells are connected in a row by the conductor to compose a solar cell string, and the positioning portion positions the conductor connected to opposite ends of the solar cell string. This allows the solar cell string to have an outer end positionally determined to reliably prevent a solar cell from being positionally displaced as the first cover and the second cover contract and expand.

Preferably, the first cover includes a colored portion to externally shield a portion internal to the first cover, and the positioning portion is disposed between the colored portion and the second cover. This allows the positioning portion to be externally invisible and can thus keep the solar cell module's appearance aesthetically.

Preferably, the positioning portion is integrated with the colored portion. This facilitates producing the positioning portion.

Preferably, the positioning portion has a tip thermally caulked to position the conductor. Thermally caulking to position the conductor can reliably position the positioning portion.

According to the present invention, a method of manufacturing the solar cell module comprises: disposing the conductor so as to contact at least one of the first and second covers having the positioning portion to position the conductor by the positioning portion; thermally caulking a tip of the positioning portion to allow the positioning portion to fix the conductor positioned by the positioning portion; and disposing the sealing material between the first cover and the second cover so as to surround the conductor fixed by the positioning portion.

In the method of manufacturing the solar cell module comprising these steps, no sealing material is interposed between the conductor and the first and second covers in the thermally caulking step, and the conductor can be reliably positioned.

The above configuration allows the positioning portion to be used to reliably position the conductor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, a solar cell module according to each embodiment of the present invention, a structure for mounting the same, and a vehicle including the same will be described with reference to the drawings. In the following description, identical or corresponding components in the figures are identically denoted and will not be described repeatedly in detail.

First Embodiment

Figure 1:
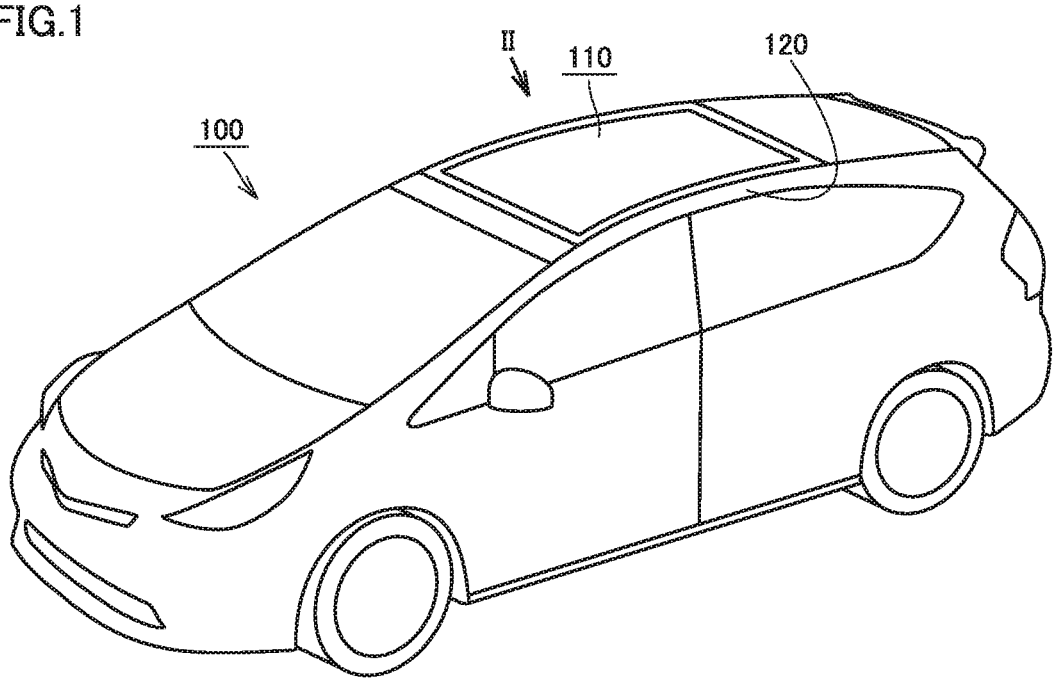
FIG. 1 is a perspective view showing an external appearance of a vehicle according to a first embodiment of the present invention.
Figure 2:
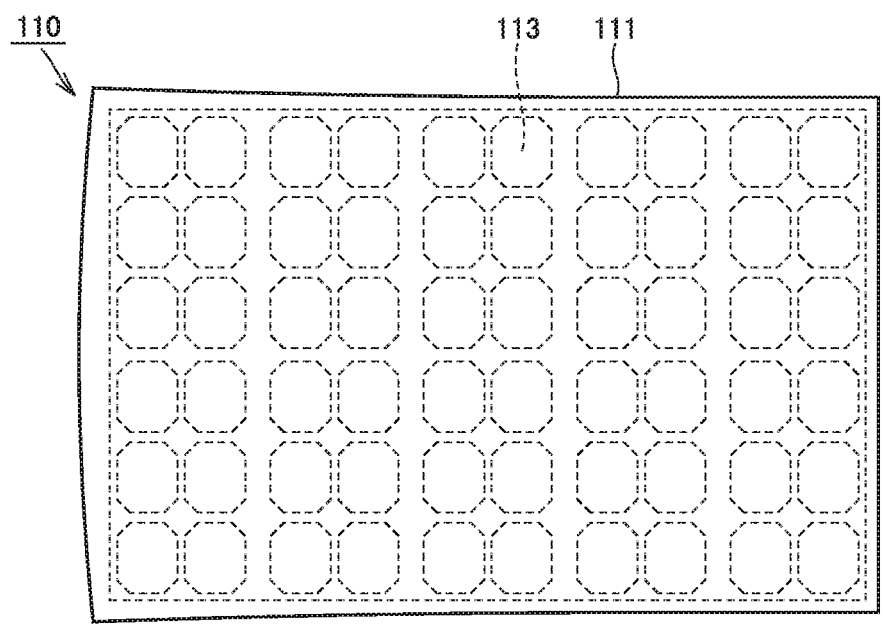
FIG. 2 is a plan view showing an external appearance of a solar cell module included in the vehicle according to the first embodiment of the present invention, as seen in a direction indicated in FIG. 1 by an arrow II.
Figure 3:
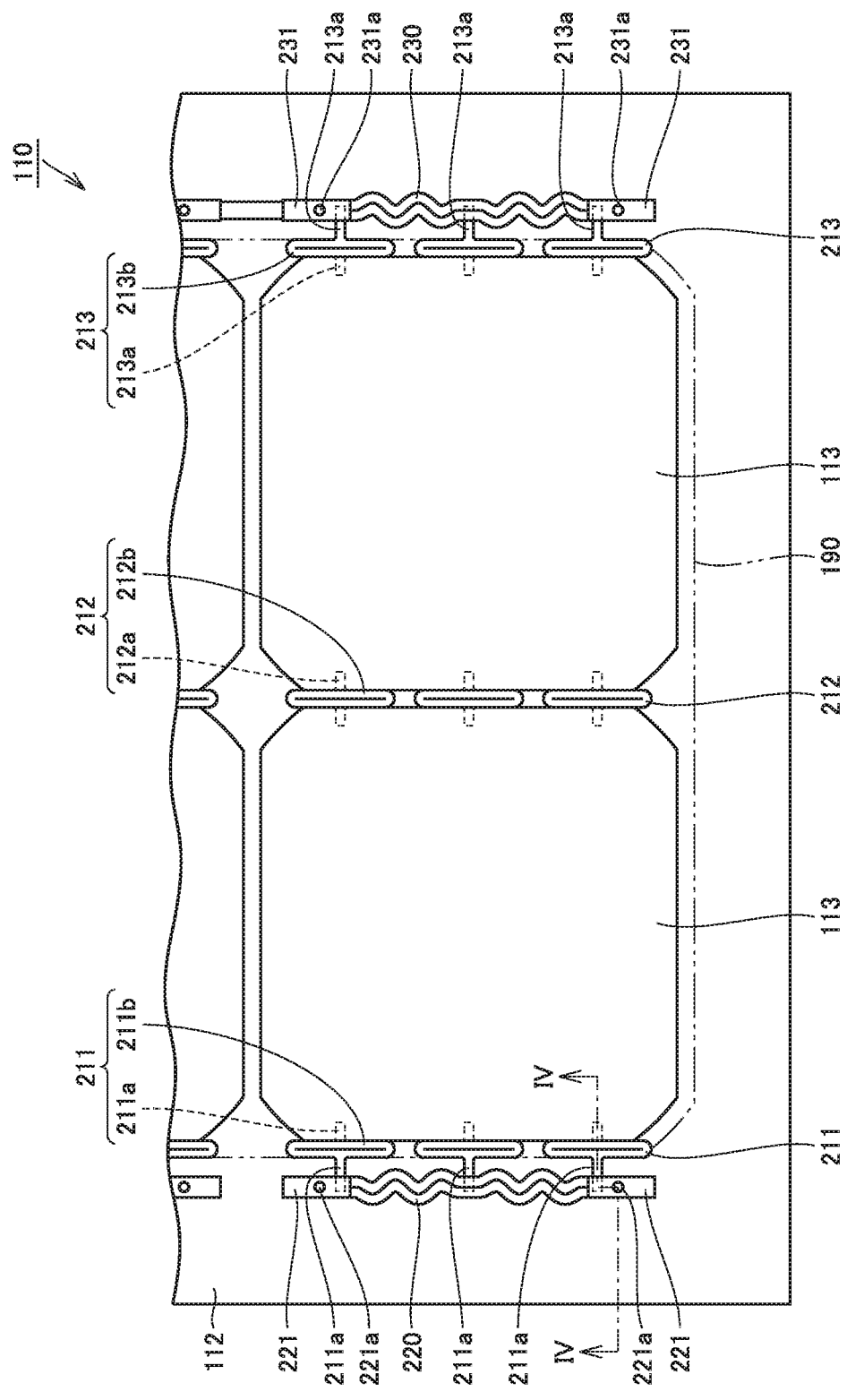
FIG. 3 is an enlarged plan view showing an internal structure of the solar cell module in FIG. 2 with a first cover removed.
Figure 4:
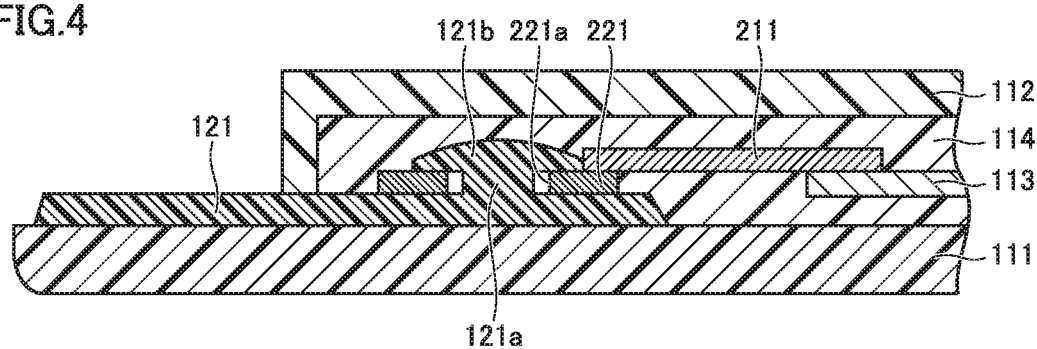
FIG. 4 is a cross-sectional view taken along a line IV-IV shown in FIG. 3.

FIG. 1 is a perspective view showing an external appearance of a vehicle according to a first embodiment of the present invention. FIG. 2 is a plan view showing an external appearance of a solar cell module included in the vehicle according to the first embodiment of the present invention, as seen in a direction indicated in FIG. 1 by an arrow II. FIG. 3 is an enlarged plan view showing an internal structure of the solar cell module in FIG. 2 with a first cover removed. For the sake of simplicity, the solar cell module has only some solar cells thereof shown in the figures. FIG. 4 is a cross-sectional view taken along a line IV-IV shown in FIG. 3.

As shown in FIGS. 1 to 4, a vehicle 100 according to the first embodiment of the present invention is an automobile, and includes a solar cell module 110 composing a roof and a roof side member 120 which is a part of a vehicular body. The vehicle is not limited to an automobile, and may be an electric railcar for example.

The solar cell module 110 includes a plate-like first cover 111 as a front plate, a second cover 112 facing the first cover 111 and serving as a back plate, a solar cell 113 disposed between the first cover 111 and the second cover 112, and a sealing material 114 which fills a space between the first cover 111 and the second cover 112 and joins them together to thus seal the solar cell 113.

The first cover 111 has a substantially rectangular external shape in a plan view. The first cover 111 is a flat plate in the present embodiment, however, it may be curved. In the present embodiment, the first cover 111 is a polycarbonate plate. However, the first cover 111 is not limited thereto, and it may be another resin plate such as acryl. The first cover 111 is formed by injection-molding or extrusion-molding polycarbonate.

Of the first cover 111, a portion facing the solar cell 113 is transparent. Solar light passes through the transparent portion, and irradiates the solar cell 113. Of the first cover 111, a portion which does not face the solar cell 113 may be provided with a colored portion 121 and thus be opaque. Being opaque can shield a portion internal to the first cover 111 and conceal wiring and adhesive around the solar cell 113. The colored portion 121 shields visible light. The colored portion 121 is only required to be non-transparent, and may not only be a chromatic color such as red, yellow, green, blue, violet, but also an achromatic color such as white, gray or black.

The second cover 112 has a substantially rectangular external shape in a plan view. In the present embodiment, the second cover 112 is in the form of a flat plate, however, when the first cover 111 is curved, the second cover 112 is curved with substantially the same curvature as the first cover 111.

In the present embodiment, the second cover 112 is a polycarbonate plate. However, the second cover 112 is not limited thereto, and it may be a plate made of another resin such as acryl, a plate made of carbon-fiber-reinforced plastic (CFRP) or a plate of a metal such as aluminum, or it may be a sheet made of resin such as polyethylene terephthalate.

The second cover 112 is formed by injection-molding polycarbonate.

Furthermore, the second cover 112 may be transparent or opaque.

A plurality of solar cells 113 are spaced from one another in a matrix. The plurality of solar cells 113 are electrically connected to one another. Specifically, a plurality of solar cells 113 disposed in a row are connected with one another in series to form a solar cell string. A plurality of such solar cell strings are connected with one another in series.

The sealing material 114 is located in a region sandwiched between the first cover 111 and the second cover 112. The sealing material 114 is in contact with the first cover 111, the second cover 112, and the solar cell 113.

In the present embodiment, the sealing material 114 is composed of EVA (ethylene-vinyl acetate). However, the material composing the sealing material 114 is not limited to EVA, and it may be PVB (poly vinyl butyral), silicone resin, ionomer resin, or the like.

Between the plurality of solar cells 113, interconnectors 211, 212, 213 are provided. The interconnectors 211, 212, 213 have pairs of leg portions 211a, 212a, 213a, respectively, and flexible portions 211b, 212b, 213b provided between the pairs of leg portions 211a, 212a, 213a, respectively.

The pairs of leg portions 211a, 212a, 213a are connected to the flexible portions 211b, 212b, 213b, respectively.

One leg portion 211a is connected to a terminal 221 or a tab line 220. The other leg portion 211a is connected to the solar cell 113. One leg portion 212a and the other leg portion 212a are connected to solar cells 113. One leg portion 213a is connected to the solar cell 113. The other leg portion 213a is connected to a terminal 231 or a tab line 230.

A pair of terminals 221 is provided with a through hole 221a. A pair of terminals 231 is provided with a through hole 231a.

On the second cover 112, the pair of terminals 221 and the tab line 220 connected to the pair of terminals 221 are disposed. The pair of terminals 221 and the tab line 220 are connected to the leg portion 211a by welding.

On the second cover 112, the pair of terminals 23 and the tab line 230 connected to the pair of terminals 231 are disposed. The pair of terminals 231 and the tab line 230 are connected to the leg portion 213a by welding.

The flexible portions 211b, 212b, 213b have a deformable shape. When the distance between the pair of leg portions 211a varies, the flexible portion 211b deforms. When the distance between the pair of leg portions 212a varies, the flexible portion 212b deforms. When the distance between the pair of leg portions 213a varies, the flexible portion 213b deforms.

A chain double-dashed line 190 shown in FIG. 3 indicates a boundary line between the colored portion and the transparent portion. Solar cell 113 is located inside the chain double-dashed line 190. The solar cell 113 is located under the transparent portion of the first cover 111. The tab lines 220 and 230 are located under the colored portion of the first cover 111.

As shown in FIG. 4, between the first cover 111 and the second cover 112, the sealing material 114, the solar cell 113, the first cover 111, and the colored portion 121 composing a portion of the first cover 111 are provided.

The colored portion 121 is integrally formed on a surface of the first cover 111 closer to the second cover in the form of a surrounding frame by two-color molding. The colored portion 121 is provided with a boss 121a. One boss 121a is inserted into the through hole 221a. The other boss 121a is inserted into the through hole 231a. The boss 121a is in contact with the second cover 112. The colored portion 121 is not only provided to surround the first cover 111 but may also be provided at any portion that does not face the solar cell 113.

While in this embodiment the boss 121a is provided to the colored portion 121 composing a portion of the first cover 111, the boss 121a may be provided to the second cover 112. Further, the boss 121a may be provided separately from the first cover 111 and the second cover 112.

According to the first embodiment, the solar cell module 110 comprises: the first cover 111 in the form of a plate having at least a portion transparently; the second cover 112 disposed to face the first cover 111; at least one solar cell 113 disposed between the first cover 111 and the second cover 112; the sealing material 114 which fills a space between the first cover 111 and the second cover 112 and joins them together to thus seal the solar cell 113; and the terminals 221 and 231 electrically connected to the solar cell 113, surrounded by the sealing material 114 between the first cover 111 and the second cover 112, and serving as a conductor. The first cover 111 has the boss 121a as a positioning portion which positions the terminals 221, 231.

A plurality of solar cells 113 are connected to one another in a row by the interconnector 212 to configure a solar cell string, and the boss 121a positions the terminals 221 and 231 connected to opposite end portions of the solar cell string via the interconnectors 211 and 213. The boss 121a may position the tab lines 220, 230 or the interconnectors 211, 213 serving as a conductor.

The first cover 111 includes the colored portion 121 for externally shielding a portion internal to the first cover, and the boss 121a is disposed on a side inner than the colored portion 121. Further, the boss 121a is integrated with the colored portion 121.

The boss 121a may have a tip 121b thermally caulked to have an increased diameter. This allows tip 121b to be larger in diameter than the through hole 221a of the terminal 221, and thus prevents the terminal 221 from escaping from the boss 121a. The boss 121a fixes the terminal 221.

The terminal 221 is in direct contact with a portion of the first cover 111, or the colored portion 121. Although not shown in FIG. 4, there is not any sealing material 114 under the terminal 231 shown in FIG. 3, either, and the terminal 231 is in direct contact with the colored portion 121.

Figure 5:
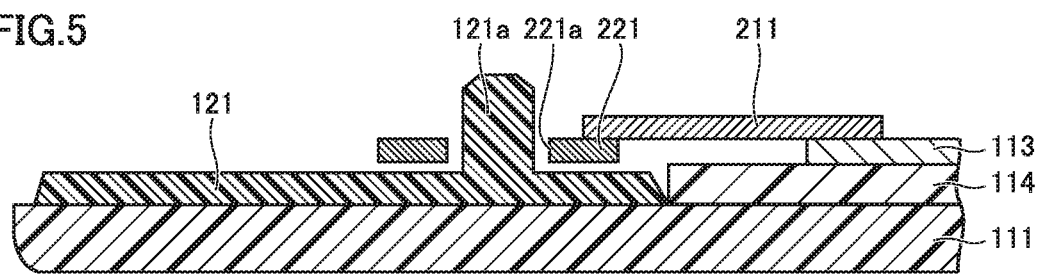
FIG. 5 is a cross-sectional view for illustrating a method of manufacturing the solar cell module according to the first embodiment.
Figure 6:
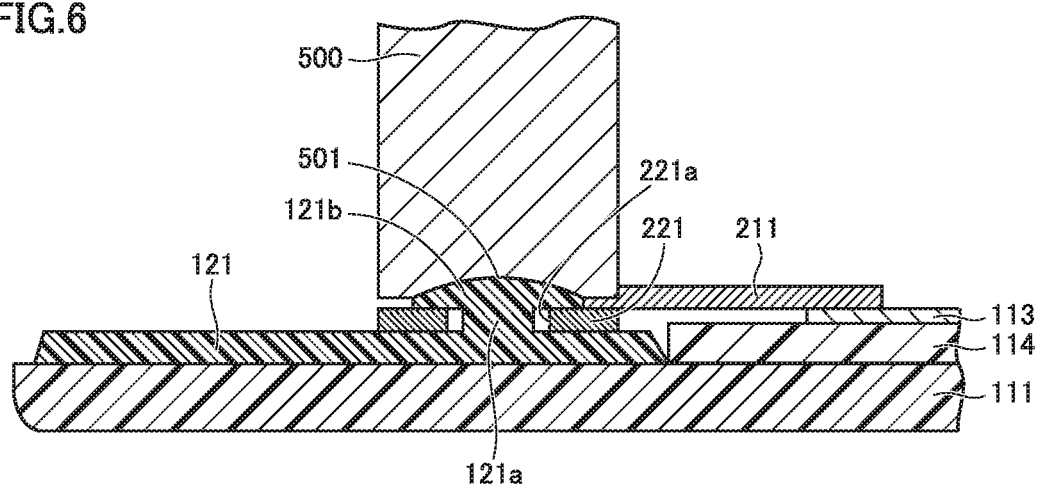
FIG. 6 is a cross-sectional view for illustrating the method of manufacturing the solar cell module according to the first embodiment.
Figure 7:
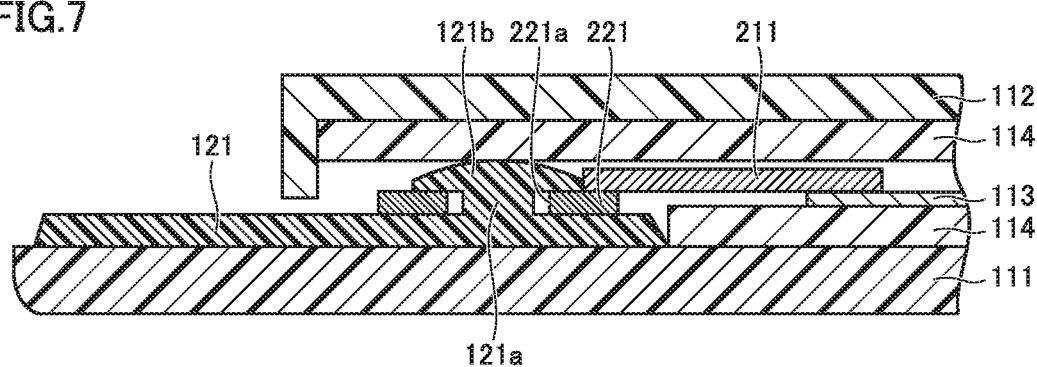
FIG. 7 is a cross-sectional view for illustrating the method of manufacturing the solar cell module according to the first embodiment.

FIGS. 5-7 are cross-sectional views for illustrating a method of manufacturing the solar cell module according to the first embodiment. As shown in FIG. 5, the through hole 221a of the terminal 221 is disposed such that the boss 121a is inserted therethrough. In doing so, the sealing material 114 is not disposed under the terminal 221. The sealing material 114 is disposed under the solar cell 113.

As shown in FIG. 6, a jig 500 is used to thermally caulk a tip of the boss 121a to increase the tip 121b in diameter. The heated jig 500 has a recess 501 having a round shape, and a resin composing the boss 121a melts along that shape. The tip 121b has a spherical external surface. The tip 121b in turn presses the terminal 221 into contact with the colored portion 121. When the boss 121a has the tip thermally caulked, there is no sealing material under the terminal 221, which allows the terminal 221 to positionally less vary. Further, the sealing material 114 does not exist between the colored portion 121 and the terminal 221, and the caulking can be done reliably.

The sealing material 114 and the second cover 112 are disposed on the boss 121a, as shown in FIG. 7. Then, the first cover 111 and the second cover 112 are heated to a temperature of about 140° C. The sealing material 114 melts and thus fills gaps between parts. In the heating step, while parts thermally expand and are thus going to move, the boss 121a inserted through the through hole 221a of the terminal 221 positions parts composing the solar cell module and thus restricts their movement. Subsequently, the temperature is decreased to room temperature to solidify the sealing material to thus complete the solar cell module shown in FIG. 3.

In the solar cell module 110 configured as described above, the boss 121a is provided such that the interconnectors 211, 212, 213 move as the first cover 111 and the second cover 112 expand and contract. Further, the pairs of terminals 221, 231 welded to the leg portions 211a, 213a are fitted through the through holes 221a, 231a, and the solar cells 113 will never move to the center as the first cover 111 and the second cover 112 expand and contract. As a result, the boss 121a can be used to reliably position the interconnectors 211, 212, 213 and the terminals 221, 231, and the solar cell 113.

Further, in the manufacturing process, the terminals 221 and 231 are disposed on the first cover 111. In doing so, the boss 121a is fitted through the through holes 221a, 231a. The second cover 112 can be disposed in this state, and the terminals 221 and 231 can be reliably positioned in the manufacturing process. Furthermore, the terminals 221 and 231 are not positionally displaced with respect to the first cover 111, which allows increased manufacturing efficiency. In addition, there is no sealing material 114 between the terminals 221, 231 and the colored portion 121, and the terminals 221 and 231 positionally less vary. As a result, the caulking can be enhanced in reliability.

Second Embodiment

Figure 8:
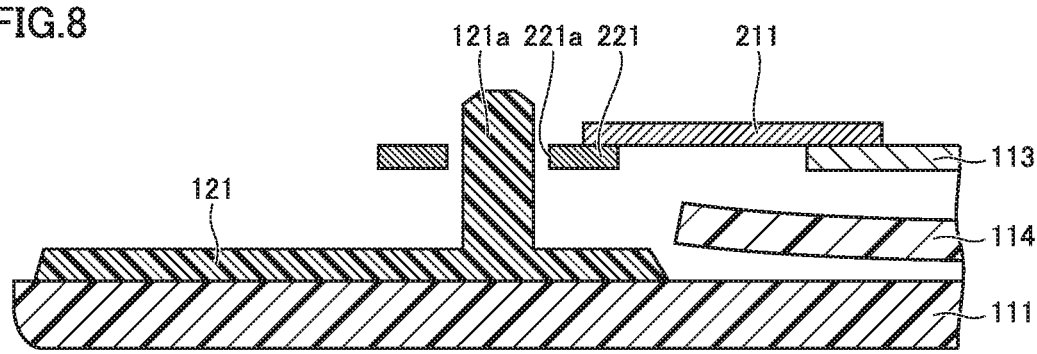
FIG. 8 is a cross-sectional view for illustrating a method of manufacturing a solar cell module according to a second embodiment.

FIG. 8 is a cross-sectional view for illustrating a method of manufacturing a solar cell module according to a second embodiment. As shown in FIG. 8, in the method of manufacturing the solar cell module according to the second embodiment, the boss 121a is larger in length than the boss 121a according to the first embodiment. Therefore, in the step shown in FIG. 8, the boss 121a can be easily fitted through the through hole 221a. Further, the terminal 221 can be prevented from escaping. Further, by subsequently thermally caulking the extended boss 121a, the boss 121a can be within the thickness of the sealing material 114. This can prevent the solar cell module as a whole from being increased in thickness and hence mass.

The present invention is applicable for example in a field of solar cell modules mounted on vehicles.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A solar cell module comprising:
   a first cover in a form of a plate having a transparent portion and a colored portion that is opaque and shields visible light;
   a second cover disposed to face the first cover;
   at least one solar cell disposed between the first cover and the second cover;
   a sealing material which fills a space between the first cover and the second cover and joins them together to thus seal the at least one solar cell, wherein the sealing material contacts the first cover and the second cover;
   a conductor electrically connected to the at least one solar cell;
   a positioning portion integrally extending from the colored portion of the first cover into a through hole of the conductor in order to fix the conductor to the colored portion of the first cover,
   wherein a tip, located between the second cover and the conductor, of the positioning portion has a diameter larger than a diameter of the through hole,
   wherein the conductor is in direct contact with the positioning portion and in direct contact with the colored portion of the first cover,
   wherein the sealing material contacts the tip of the positioning portion that extends from the colored portion of the first cover,
   wherein the sealing material is not disposed between the conductor and the first cover, and
   wherein the positioning portion is formed of resin material, wherein the colored portion of the first cover is formed as a surrounding frame that surrounds the at least one solar cell as viewed in a plan view.

2. The solar cell module according to claim 1, wherein:
   the at least one solar cell includes a plurality of solar cells that are connected in a row by the conductor to compose a solar cell string; and
   the positioning portion positions the conductor connected to opposite ends of the solar cell string.

3. The solar cell module according to claim 1, wherein the sealing material is in contact with the at least one solar cell.

4. The solar cell module according to claim 1, wherein the at least one solar cell located under the transparent portion of the first cover, and in an area that is surrounded by the colored portion.

5. The solar cell module according to claim 1, wherein the plate shape of the first cover is flat or curved.

6. A method of manufacturing a solar cell module, the solar cell module including a first cover in a form of a plate having a transparent portion and a colored portion that is opaque and shields visible light; a second cover disposed to face the first cover; at least one solar cell disposed between the first cover and the second cover; a conductor electrically connected to the at least one solar cell; a positioning portion integrally extending from the colored portion of the first cover into a through hole of the conductor in order to fix the conductor to the colored portion of the first cover, the method comprising:
   disposing the conductor on the positioning portion so that the positioning portion is inserted through the through hole of the conductor, the conductor being in direct contact with the positioning portion and in direct contact with the colored portion of the first cover;
   thermally caulking a tip, located between the second cover and the conductor, of the positioning portion, being formed of resin, to increase a diameter of the tip to be larger than a diameter of the through hole in order to fix the conductor; and
   disposing and heating a sealing material to fill a space between the first cover and the second cover and join the first cover and the second cover together to thus seal the at least one solar cell, wherein the sealing material contacts the first cover and the second cover, wherein the sealing material contacts the tip of the positioning portion that extends from the colored portion of the first cover, and wherein the sealing material is not disposed between the conductor and the first cover, wherein the colored portion of the first cover is formed as a surrounding frame that surrounds the at least one solar cell as viewed in a plan view.

* * * * *